United States Patent [19]

Porter

[11] 4,373,990
[45] Feb. 15, 1983

[54] DRY ETCHING ALUMINUM
[75] Inventor: Roy A. Porter, Whitehall, Pa.
[73] Assignee: Bell Telephone Laboratories, Incorporated, Murray Hill, N.J.
[21] Appl. No.: 223,333
[22] Filed: Jan. 8, 1981
[51] Int. Cl.³ ............... C23F 1/02; H01L 21/306; C03C 15/00; C03C 25/06
[52] U.S. Cl. ............... 156/643; 156/646; 156/656; 156/659.1; 156/665; 204/192 E
[58] Field of Search ............ 156/643, 646, 656, 665, 156/659.1, 345; 204/164, 192 EC, 192 E, 298; 427/38, 39; 252/79.1

[56] References Cited
U.S. PATENT DOCUMENTS

| | | | |
|---|---|---|---|
| 3,522,118 | 7/1970 | Taylor et al. | 156/646 |
| 4,026,742 | 5/1977 | Fujino | 156/643 |
| 4,030,967 | 6/1977 | Ingrey et al. | 156/643 |
| 4,073,669 | 2/1978 | Heinecke et al. | 156/643 |
| 4,182,646 | 1/1980 | Zajac | 156/643 |
| 4,256,534 | 3/1981 | Levinstein et al. | 156/643 |
| 4,299,680 | 11/1981 | Fontana et al. | 156/643 X |

FOREIGN PATENT DOCUMENTS 2026922  2/1980  United Kingdom ............... 156/643

OTHER PUBLICATIONS

Philips Tech. Rev. 38, No. 7/8, 1978/79, pp. 200–210, Plasma etching in IC Technology by Kalter et al.
IBM Tech. Disclosure Bulletin, vol. 20, No. 5, Oct. 1977, Isotropic and Anisotropic Etching In a Diode System by Gartner et al, pp. 1744–1745.

Primary Examiner—William A. Powell
Attorney, Agent, or Firm—Arthur J. Torsiglieri

[57] ABSTRACT

A dry etching process for aluminum uses a silicon tetrachloride gas ambient to which is applied radio frequency power for ionizing the gas. By appropriate control of the gas pressure and power density, anisotropic etching is achieved. This gas system also is useful for etching dual layers of aluminum and doped polycrystalline silicon.

1 Claim, 3 Drawing Figures

DRY ETCHING ALUMINUM

BACKGROUND OF THE INVENTION

This invention relates to dry etching of aluminum and aluminum-rich alloys.

In the fabrication of semiconductor devices, the advantages of dry etching, such as plasma and reactive sputter etching, in permitting better control of the etching features is becoming increasingly recognized and dry etching is now well established, particularly in the preparation of semiconductive chips involving fine detail, such as is involved in large capacity memory chips.

In semiconductor technology, a favored metal for use in providing interconnections is aluminum either in pure form or more commonly alloyed with relatively small amounts of additives, such as copper or silicon, which will still be referred to hereinafter as aluminum.

Accordingly, there is a need in semiconductor technology for a dry etching process for patterning such aluminum layers.

Various techniques have been proposed hitherto. Typically these involve forming a plasma of a gas which, after ionization, selectively reacts with aluminum to etch it preferentially, and in which the reactive energetic ions impinge on the aluminum workpiece with sufficient directionality that the aluminum is etched anisotropically. This is to provide substantially vertical edges to the etched pattern and to reduce the waste of lateral area of the semiconductive chip.

It is now generally recognized that the chlorine ion is especially effective for etching aluminum because of the low vapor pressure and hence volatility of aluminum chloride which is readily formed by its interaction with aluminum. In the past the chlorine ion typically has been derived by the inclusion of chlorine gas either alone or in combination with boron trichloride or carbon tetrachloride gas. The combinations have been found preferable where the aluminum layer had developed a native oxide film which had to be bared to reach the aluminum metal. One problem with such systems has been the strong tendency with the use of such gas systems to form polymer deposits on the equipment which interferes with the normal operation. Such tendency often is the result of moisture in the apparatus.

SUMMARY OF THE INVENTION

Accordingly, in my experience such gas systems have not been sufficiently satisfactory and I believe my invention provides an improvement over such systems. In particular in accordance with my invention, ion etching of aluminum utilizes silicon tetrachloride (SiCl$_4$) as the source of the reactive ion with the conditions being adjusted that efficient anisotropic etching is achieved.

The use of SiCl$_4$ under appropriate conditions has proven particularly advantageous because it can result in little erosion of the usual photoresists used as a mask for patterning the aluminum layer, a factor which helps maintain the integrity of the aluminum features. It also can make possible etching which is highly uniform and sufficiently anisotropic. It is important to control the gas pressure and the power in the plasma for optimum results.

Also of special interest is the fact that this gas system is also quite effective for etching polycrystalline silicon so that dual layers of polycrystalline silicon and aluminum can be etched conveniently. Such dual layers are becoming of increasing importance for interconnection purposes in integrated circuits.

BRIEF DESCRIPTION OF THE DRAWING

The invention will be readily understood from the following more detailed description taken with the drawing in which.

DETAILED DESCRIPTION

Figure 1:
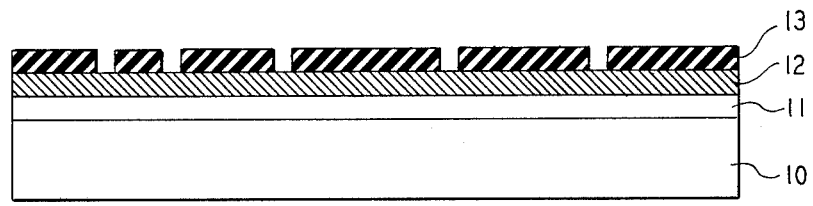
FIG. 1 shows a silicon wafer including an aluminum layer to be etched in accordance with the practice of the invention.

FIG. 1 illustrates a typical structure to be etched. It comprises a monocrystalline silicon wafer 10 which has been treated to form therein a number of zones of different conductivity types (not shown) to define a number of circuit elements, groups of which are to be interconnected in prescribed ways to form a plurality of integrated circuits. Eventually the wafer will be cut up into a plurality of chips each of which will include one or more integrated circuits. Typically the wafer will be tens of mils thick with a radius of several inches and eventually will be cut up into chips about one or two hundred mils square.

As shown, the wafer 10 includes over one major surface in turn a dielectric layer of silicon oxide 11 and a conductive layer of aluminum 12. In practice there may be other or different layers intermediate the oxide and the aluminum but this is not relevant to the principles of the instant invention. The aluminum layer typically is several thousands of angstroms thick and has been deposited by an evaporation process. It is to be patterned in accordance with the mask 13 that has been formed over its top surface. Typically the mask features have dimensions of microns, which features are to be reproduced with high fidelity in the alumnium layer. The mask itself is composed of a photoresist material which was initially deposited as a film of uniform thickness, exposed with radiation of the desired pattern, and then treated to transfer the radiation pattern into the mask shown.

In etching the aluminum layer, it is desirable to avoid erosion of the mask lest the fidelity of the transfer be affected deleteriously. It is advantageous that the gas system of the invention little affects available photoresists of suitable properties for the desired lithographic processes. In particular, resist types 204 and 206 made by the Philip Hunt Chemical Company have proven suitable. The thickness of the mask layer should be enough so that its effectiveness survives any erosion that does occur during the etching. Typically the resist is 1.5$\mu$ thick. Erosion is also undesirable to avoid the buildup of injurious deposits on the etching apparatus which impair its effectiveness.

Figure 2:
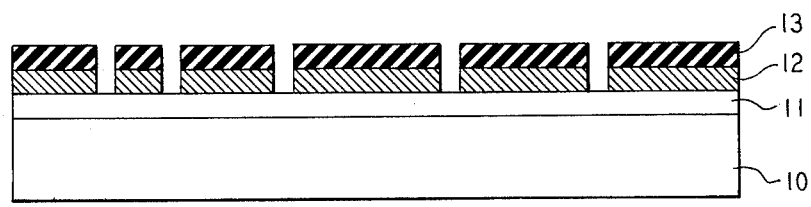
FIG. 2 shows the wafer after the layer has been etched in accordance with the practice of the invention.

FIG. 2 shows the wafer 10 after it has been treated to transfer the mask pattern to the aluminum layer 12. It is to be noted that the walls of the apertures made in the aluminum are substantially vertical as is desirable to permit maximum packing density of features in the aluminum.

Figure 3:
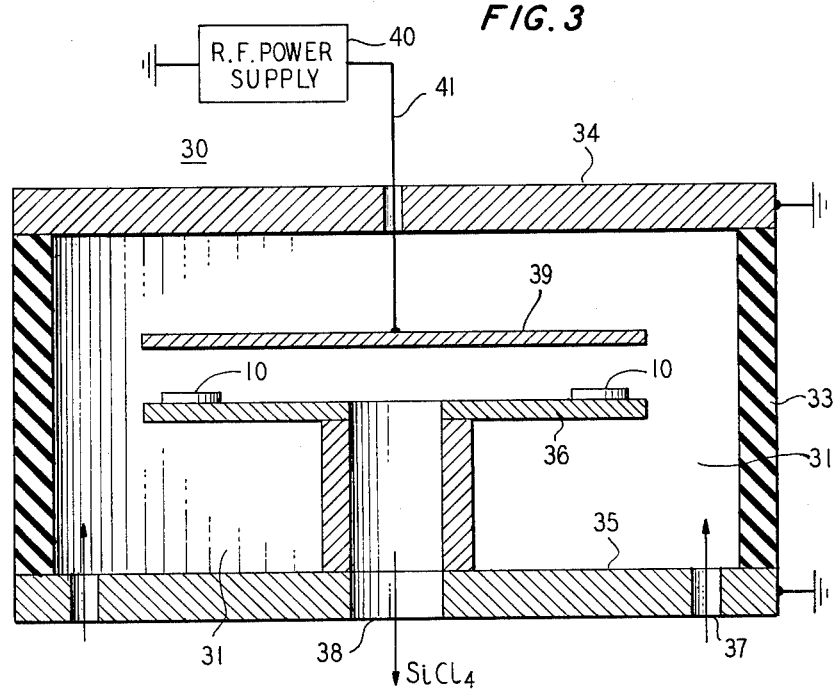
FIG. 3 shows typical apparatus for the practice of the invention.

The etching is typically done with apparatus of the kind shown in very simplified form in FIG. 3.

The parallel-plate reactor 30, shown in FIG. 3, comprises an etching chamber 31 defined by a cylindrical insulating member 33 which is closed by opposite conductive end plates 34, 35. In addition, a workpiece holder 36 is provided which is designed to support a number of workpieces 10, which are wafers of the type shown in FIG. 1. The wafers are shown arranged in a circle. Provision is made by way of the annular opening 37 to supply the active gas, silicon tetrachloride, into the etching chamber and to exhaust the spent gas including the volatile reaction products by way of a central outlet 38. A planar anode electrode 39 is positioned parallel to and opposite the face of the holder 36 supporting the wafers to define with the holder a discharge space formed therebetween. An rf power supply 40 is used to establish a radio frequency electric field, typically at 13.56 megahertz, between the holder 36 and the anode 39. As shown, the holder 36 and the end plates 34, 35 are kept at ground potential while the anode 39 is maintained "hot" by means of the conductor 41 from the power supply 40. Provision can be included for localizing the plasma to the space between the cathode and anode.

There has been also omitted the various other elements important for monitoring the gas flow and the amount of power supplied, for detecting the end of the desired etching, and for maintaining the desired pressures within the reaction chamber.

For optimum results, I have found certain considerations important. It is important to keep out of the chamber oxygen, hydrogen, fluorine and their compounds, although my system has more tolerance to slight amounts of water vapor than most prior art systems. There needs to be avoided the buildup of aluminum chloride deposits in the apparatus. It has proven helpful to load the wafers into the apparatus while it is warm to minimize the reaction of any moisture present with any aluminum chloride.

It is advantageous to use silicon tetrachloride vapor of high purity, e.g., 99.98% pure, as the active gas. The addition of an inert carrier gas, such as nitrogen, slows the etching rate, and the silicon tetrachloride is best used undiluted unless slowing is desired.

It is found that the rate, the selectivity and the degree of anisotropy, of the etching action is related to the power density in the active region. For 16-inch diameter anode and cathode plates spaced apart about 1¼ inches, it was found optimum to supply about 1000 watts into the machine.

Figure 4:
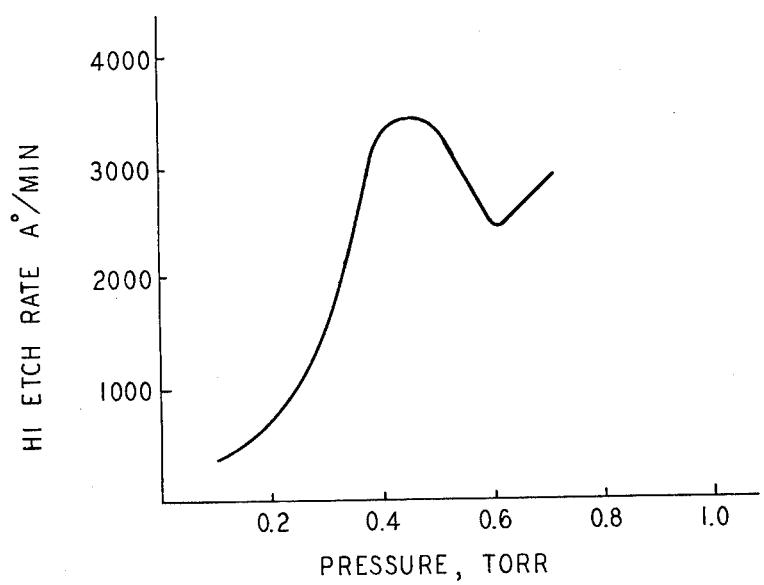

In FIG. 4, there is plotted the etch rate of the aluminum against the gas pressure with the power maintained constant at 1000 watts. The etch rate increases with pressure up to a point and then falls off before increasing again. The falloff is probably the result of increasing collisions between ions and a slowing of their impact velocity on the aluminum.

Figure 5:
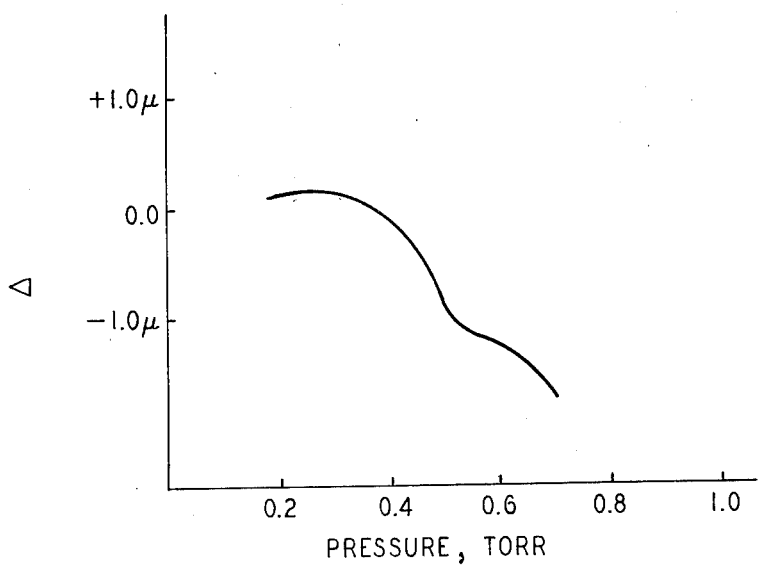

In FIG. 5 there is plotted Δ, a measure of the departure from the vertical, against gas pressure for constant power at 1000 watts. It is usually desirable to operate so as to maintain Δ small while achieving a reasonable etching rate.

The etching rate tends to increase with power. There is a minimum power for each pressure which needs to be applied to keep the plasma stable.

In the apparatus described, I found it preferable to operate with a pressure of about 0.32 torr at 1000 watts to achieve a high degree of anisotropy consistent with a suitably fast etching rate.

In the operation described, it was found that the plasma had a relatively large dark space with a vertical gradient but there appeared to be little d-c bias developed in the plasma. Accordingly, this would be described as a plasma etching mode. It should also be feasible, in accordance with the invention, to operate in the so-called reactive sputter etch mode in which an appreciable d-c bias is developed between the cathode and anode plates of the reactor. To achieve this mode, it is usual to make the cathode, which supports the workpiece being etched, smaller in effective surface area than the anode member, and to operate at gas pressures considerably lower, typically less than a tenth of a torr. While this mode achieves faster etching rates, due to the higher velocity of the ions as they impinge on the aluminum, it also tends to result in faster erosion of the resist which can cause the buildup of injurious deposits on the equipment.

Operating at 0.32 torr pressure and 1000 watts power, the aluminum was etched at a rate of about 1500 angstroms per minute while the resist was eroded at a rate of less than 200 angstroms per minute. It was also found that under these conditions, silicon oxide was etched at a rate of less than 50 angstroms per minute while doped polycrystalline silicon of the kind used for the interconnection conductor in many silicon integrated circuits would be etched at the rate of about 500 angstroms per minute.

As a result of its ability to etch doped polycrystalline silicon relatively rapidly, the gas system described is also useful for etching, in a single operation, dual layers comprising an underlying doped polycrystalline layer capped with an aluminum layer, each typically of a thickness of several thousands of angstroms. Such dual layers are becoming of increasing interest for interconnection use in high density fine line integrated circuits. In etching dual layers, it usually will be desirable to increase the thickness of the photoresist appropriately to insure the continued effectiveness of the mask until the desired etching is completed.

Various known techniques are available for detecting when the desired etching is complete, including simple visual detection.

It can be appreciated that the operating conditions can be varied from the preferred values described. In particular, it is known that the absolute level of the power supplied is not as important as the power denisty supplied. If higher etching rates were desired, higher power densities could be used, particularly were it desired to operate in a reactive sputter etching mode in which high velocities are to be generated for the ions impacting the workpiece. Similarly it is known that the etching rate can be affected by heating the wafer. pg,9

What is claimed is:

1. A process for etching a desired pattern in a dual layer of aluminum and doped polycrystalline silicon overlying a semiconductive wafer comprising forming over the dual layer an etch-resistant mask apertured in accordance with the desired pattern and exposing the masked wafer to an ambient consisting essentially of substantially pure silicon tetrachloride vapor which has been ionized for a time and at a gas pressure and power density that the desired pattern is etched anisotropically in the dual layer in a single operation.

* * * * *